United States Patent
Gustin et al.

(10) Patent No.: US 6,828,192 B2
(45) Date of Patent: Dec. 7, 2004

(54) SEMICONDUCTOR MEMORY CELL AND METHOD FOR FABRICATING THE MEMORY CELL

(75) Inventors: Wolfgang Gustin, Anzing (DE); Ulrike Grüning-Von Schwerin, München (DE); Dietmar Temmler, Dresden (DE); Martin Schrems, Eggersdorf B. Graz (AT); Stefan Rongen, Dresden (DE); Rudolf Strasser, Hsin Chu (TW)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/657,928

(22) Filed: Sep. 10, 2003

(65) Prior Publication Data

US 2004/0157389 A1 Aug. 12, 2004

Related U.S. Application Data

(63) Continuation of application No. PCT/DE02/00788, filed on Mar. 5, 2002.

(30) Foreign Application Priority Data

Mar. 9, 2001 (DE) .......................................... 101 11 498

(51) Int. Cl.[7] .......................................... H01L 21/8242
(52) U.S. Cl. ....................... 438/249; 438/245; 438/239; 438/388
(58) Field of Search ................................ 438/388, 392, 438/386, 239, 245, 249, 238; 257/301, 304

(56) References Cited

U.S. PATENT DOCUMENTS

| | | | |
|---|---|---|---|
| 5,360,758 A | 11/1994 | Bronner et al. | |
| 5,670,805 A | 9/1997 | Hammerl et al. | |
| 5,744,386 A | 4/1998 | Kenney | |
| 5,827,765 A | 10/1998 | Stengl et al. | |
| 6,509,599 B1 | * 1/2003 | Wurster et al. | ............. 257/301 |
| 6,566,177 B1 | * 5/2003 | Radens et al. | ............. 438/152 |
| 2003/0168690 A1 | * 9/2003 | Karcher et al. | ............. 257/301 |

FOREIGN PATENT DOCUMENTS

| | | |
|---|---|---|
| DE | 196 20 625 C1 | 10/1997 |
| DE | 100 45 694 A1 | 4/2002 |
| EP | 0 971 414 A1 | 1/2000 |
| WO | 00/35006 | 6/2000 |

OTHER PUBLICATIONS

L. Nesbit et al.: "A 0.6 $\mu m^2$ 256Mb Trench DRAM Cell With Self–Aligned BuriEd STrap (BEST)", *IEDM 1993*, pp. 627–630.

(List continued on next page.)

*Primary Examiner*—Van Thu Nguyen
*Assistant Examiner*—Brad Smith
(74) *Attorney, Agent, or Firm*—Laurence A. Greenberg; Werner H. Stemer; Gregory L. Mayback

(57) ABSTRACT

A trench capacitor is formed in a trench, which is disposed in a substrate. The trench is filled with a conductive trench filling which functions as an inner capacitor electrode. An epitaxial layer is grown on the sidewall of the trench on the substrate. A buried strap is disposed between the conductive trench filling with the second intermediate layer and the epitaxially grown layer. A dopant outdiffusion formed from the buried strap is disposed in the epitaxially grown layer. Through the epitaxially grown layer, the dopant outdiffusion is further removed from a selection transistor disposed beside the trench, as a result of which it is possible to avoid short-channel effects in the selection transistor.

21 Claims, 12 Drawing Sheets

OTHER PUBLICATIONS

G. Bronner et al.: "A Fully planarized 0.25μm CMOS Technology for 256Mbit DRAM and Beyond", *1995 Symposium on VLSI Technology Digest of technical Papers*, Kyoto, Japan, pp. 15–16.

Stanley Wolf: "Silicon Processing For The VLSI Era—vol. 2: Process Integration", *Lattice Press*, Sunset Beach, California, cover page only.

D. Widmann et al.: "Technologie hochintegrierter Schaltungen", *Springer Verlag*, Heidelberg, Germany, $2^{nd}$ ed., cover page only.

U. Gruening et al.: A Novel Trench DRAM Cell with a VERtIcal Access Transistor and BuriEd Strap (VERI Best) for 4Gb/16Gb, *IEEE, 1999*, 4 pp.

* cited by examiner

SEMICONDUCTOR MEMORY CELL AND METHOD FOR FABRICATING THE MEMORY CELL

CROSS-REFERENCE TO RELATED APPLICATION

This application is a continuation of copending International Application No. PCT/DE02/00788, filed Mar. 5, 2002, which designated the United States and was not published in English.

BACKGROUND OF THE INVENTION

FIELD OF THE INVENTION

The present patent application relates to a semiconductor memory cell and a method for fabricating it. The semiconductor memory cell contains a selection transistor and a trench capacitor formed in a trench.

Memory devices, such as dynamic random access memories (DRAMs), for example, contain a cell array and an addressing periphery, individual memory cells being disposed in the cell array.

A DRAM chip contains a matrix of memory cells that are disposed in the form of rows and columns and are addressed by word lines and bit lines. Data are read from the memory cells or data are written to the memory cells by the activation of suitable word lines and bit lines.

A DRAM memory cell usually contains a transistor connected to a capacitor. The transistor contains, inter alia, two diffusion regions separated from one another by a channel controlled by a gate. One diffusion region is referred to as the drain region and the other diffusion region is referred to as the source region.

One of the diffusion regions is connected to a bit line, the other diffusion region is connected to the capacitor and the gate is connected to a word line. By applying suitable voltages to the gate, the transistor is controlled in such a way that a current flow between the diffusion regions through the channel is switched on and off.

The integration density is continuously increased by the advancing miniaturization of memory devices. The continuous increase in the integration density results in that the area available per memory cell decreases further and further. If the selection transistor is formed as a planar transistor, for example, then the lateral distance between the selection transistor and the trench capacitor consequently decreases further and further. That leads to a reduction of the blocking capability of the selection transistor, which blocks more poorly with decreasing channel length on account of the short-channel effect. The increased leakage currents discharge the trench capacitor prematurely, as a result of which the information stored in the trench capacitor and the memory cell is lost.

The short-channel effects are intensified by the outdiffusion of a buried strap. The buried strap is usually disposed in the trench capacitor above the conductive trench filling and serves for electrically connecting the conductive trench filling to a doping region of the transistor. In this case, an outdiffusion of dopant from the buried strap into the substrate and the adjoining doping region of the selection transistor is usually carried out, thereby forming the electrical contact. What is disadvantageous about a conventional buried strap is that it intensifies the short-channel effects that occur.

A further problem known from the prior art is that the doping region of the selection transistor is usually to be formed in monocrystalline silicon in order to avoid leakage currents through the selection transistor. Since the buried strap is usually formed from polycrystalline silicon which adjoins the monocrystalline silicon of the doping region of the selection transistor, at elevated temperatures crystal dislocations are formed in the monocrystalline silicon proceeding from the interface between polysilicon and monocrystalline silicon, and can lead to leakage currents through the selection transistor.

What is disadvantageous about an epitaxially grown buried strap is that crystal dislocations are formed at the transition between the silicon grown epitaxially in monocrystalline form and silicon grown in polycrystalline form. This defect formation leads to increased leakage currents in the selection transistor. During the further fabrication process of the DRAM, the dislocations move and can short-circuit the selection transistor.

Fabrication methods for DRAM memory cells having a trench capacitor and selection transistor are specified for example in U.S. Pat. Nos. 5,360,758, 5,670,805 and 5,827,765 and the reference by U. Gruening et al. title "A Novel Trench DRAM Cell with a Vertical Access Transistor and Buried Strap for 4 Gb/16 Gb", IEDM, 1999.

SUMMARY OF THE INVENTION

It is accordingly an object of the invention to provide a semiconductor memory cell and a method for fabricating the memory cell that overcome the above-mentioned disadvantages of the prior art devices and methods of this general type, which enables an improved doping profile of the buried strap and avoidance of crystal defects in the selection transistor. With the foregoing and other objects in view there is provided, in accordance with the invention, a method for fabricating a semiconductor memory having a trench capacitor and a selection transistor. The method includes providing a substrate having a substrate surface with a trench formed therein, forming an insulation collar in an upper region of the trench and on a sidewall of the trench, depositing a dielectric layer functioning as a capacitor dielectric on the insulation collar, providing a conductive trench filling in the trench, sinking the conductive trench filling into the trench to a first sinking depth, removing the dielectric layer from the insulation collar in a region above the first sinking depth, sinking the conductive trench filling into the trench to a second sinking depth, uncovering the substrate at the sidewall of the trench above the conductive trench filling resulting in an uncovered sidewall, growing an epitaxial layer on the uncovered sidewall of the trench, forming an intermediate layer on the epitaxial layer, introducing a dopant into the epitaxial layer, and completing the trench capacitor and the selection transistor.

One advantage of the epitaxially grown layer is that the dopant outdiffused from the buried strap has a shorter diffusion length in the epitaxially grown layer than in the adjoining bulk silicon in which the selection transistor is formed. This has the result that the dopant outdiffused from the buried strap does not diffuse right into the channel of the selection transistor, thereby preventing intensification of the short-channel effect in the selection transistor. The first intermediate layer has the advantage that crystal dislocations formed in the buried strap do not grow into the monocrystalline substrate in which the selection transistor is disposed. Crystal defects are thereby avoided at the doping region of the transistor, whereby it is possible to achieve an improved transistor with small leakage currents.

It is preferably provided that the epitaxially grown layer is disposed on the sidewall of the trench above the insulation collar in the direction of the substrate surface. This improves the dopant profile of the outdiffusion above the insulation collar.

Usually, a capacitor dielectric is disposed in the trench between the conductive trench filling and the substrate.

A further refinement of the invention provides for the selectively epitaxially grown layer (SEG: selective epitaxial growth) to have a facet having an angle of approximately 45 degrees relative to the substrate surface. The facet has the advantage that the electrical resistance between the doping region of the transistor and the conductive trench filling is reduced on account of the facet geometry. The facet is, for example, a natural crystal orientation of silicon.

A further refinement provides for the facet to be situated at the lower end of the epitaxially grown layer above the insulation collar. In particular, it is provided that a barrier layer is introduced in an annular gap formed by the facet and the upper edge of the insulation collar, which barrier layer prevents a diffusion of dopants to the sidewall of the trench. Since the thickness of the epitaxially grown layer decreases towards the upper and lower edges, it is advantageous to fill the annular gap which is produced at the lower edge and is formed by the facet and the upper edge of the insulation collar with a diffusion-blocking material before the trench filling is introduced, which is generally composed of polysilicon with dopants added to it, which can diffuse into the substrate beside the sidewall of the trench.

It is preferably provided that a dopant is introduced in the epitaxially grown layer and the adjoining substrate in order to form a conductive electrical connection to the buried strap. The introduced dopant has the advantage that a low-resistance electrical connection is made possible between the conductive trench filling and the doping region of the selection transistor. The introduced dopant is usually referred to as buried strap outdiffusion, since it is usually diffused out of the buried strap into the substrate.

It is preferably provided that the trench isolation has an insulation layer disposed on the buried strap and on the facet. The insulation layer disposed on the buried strap and on the facet has the advantage that, in the case of a planar selection transistor, a passing word line insulated from the trench capacitor can be disposed on the trench isolation. In the case of a memory cell with a vertical selection transistor, an active word line for driving the cell transistor runs above the trench.

A further refinement of the invention provides for the insulation collar to contain two layers that can be etched selectively with respect to one another.

With regard to the method, the object according to the invention is achieved by a method for fabricating a semiconductor memory having a trench capacitor and a selection transistor. A substrate is provided which has a substrate surface and in which a trench having an upper region is disposed. An insulation collar is disposed in the upper region on the sidewall of the trench. A conductive trench filling is disposed in the trench, and the conductive trench filling is subsequently sunk into the trench. The substrate is uncovered at the sidewall of the trench above the conductive trench filling. An epitaxial layer is grown on the uncovered sidewall of the trench. A first intermediate layer is formed on the epitaxially grown layer. A dopant is introduced into the epitaxially grown layer, and the trench capacitor and the selection transistor are finished.

The method according to the invention contains steps for forming the first intermediate layer and for forming the epitaxially grown layer which have the advantages described in connection with the way in which the object is achieved in respect of the subject-matter.

It is preferably provided that the substrate is uncovered at the sidewall of the trench by removing an upper part of the insulation collar. The epitaxial layer can thus be applied above the insulation collar in the direction of the substrate surface.

It is preferably provided that after the provision of the substrate, a dielectric layer of a capacitor dielectric is deposited onto the insulation collar before the conductive trench filling is formed, and in that the conductive trench filling is first sunk into the trench as far as a first sinking depth, the dielectric layer is subsequently removed from the insulation collar above the first sinking depth and the conductive trench filling is then sunk into the trench as far as a second sinking depth before the substrate is uncovered above the conductive trench filling. In this case, the depth to which the insulation collar is removed is set with the aid of the capacitor dielectric.

As an alternative to this, it is provided that a substrate is provided which already has a capacitor dielectric in a lower region of the trench, the capacitor dielectric having been introduced before the formation of the insulation collar, and in that the dielectric layer is deposited on the insulation collar only after the formation of the insulation collar. In this case; after the formation of the insulation collar, a further dielectric layer is applied thereto in order to set the depth to which the insulation collar is removed.

A first variant of the last-mentioned type of embodiment provides that the conductive trench filling is first sunk into the trench as far as a first sinking depth, the dielectric layer is subsequently removed from the insulation collar above the first sinking depth and the conductive trench filling is then sunk into the trench as far as a second sinking depth before the substrate is uncovered above the conductive trench filling. In this case, the dielectric layer—like the capacitor dielectric otherwise—is removed after a first etching-back of the trench filling, thereby defining the depth to which the insulation collar is removed.

A second variant of the last-mentioned type of embodiment provides that the conductive trench filling is first sunk into the trench as far as a first sinking depth, the substrate is then uncovered at the sidewall of the trench and a dielectric layer is subsequently deposited directly onto the uncovered sidewall of the trench, and in that the conductive trench filling is subsequently sunk into the trench as far as a second sinking depth and the dielectric layer is removed from the sidewall of the trench before the epitaxial layer is grown. In this case the insulation collar is not covered by the dielectric layer, rather the latter is applied directly to the sidewall of the trench only after the insulation collar has been partially removed. In this variant of the above type of embodiment, the dielectric layer has the function of protecting the substrate at the trench sidewall during the second etching-back of the trench filling.

In the above types of embodiment, the sidewall of the trench is uncovered in each case in the upper region of the trench only as far as the first sinking depth and the conductive trench filling is spaced apart from the uncovered sidewall of the trench by a distance which approximately corresponds to the difference between the first and second sinking depths. The uncovering of the sidewall results in that the monocrystalline silicon of the substrate in which the trench is formed is uncovered. The epitaxially grown layer can subsequently be grown on the uncovered monocrystalline silicon of the substrate. Later, in a customary manner, a trench isolation is formed in the substrate and in the trench. The trench isolation isolates the present memory cell from adjacent memory cells, thereby preventing leakage currents.

It is preferably provided that the epitaxially grown layer is grown in such a way that a facet is formed with an angle of approximately 45 degrees relative to the substrate surface. The facet of the epitaxially grown layer has the advantage that the electrical connection of the conductive trench filling to the doping region of the selection transistor can be formed with a lower resistance on account of the geometrical configuration.

Other features which are considered as characteristic for the invention are set forth in the appended claims.

Although the invention is illustrated and described herein as embodied in a semiconductor memory cell and a method for fabricating the memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
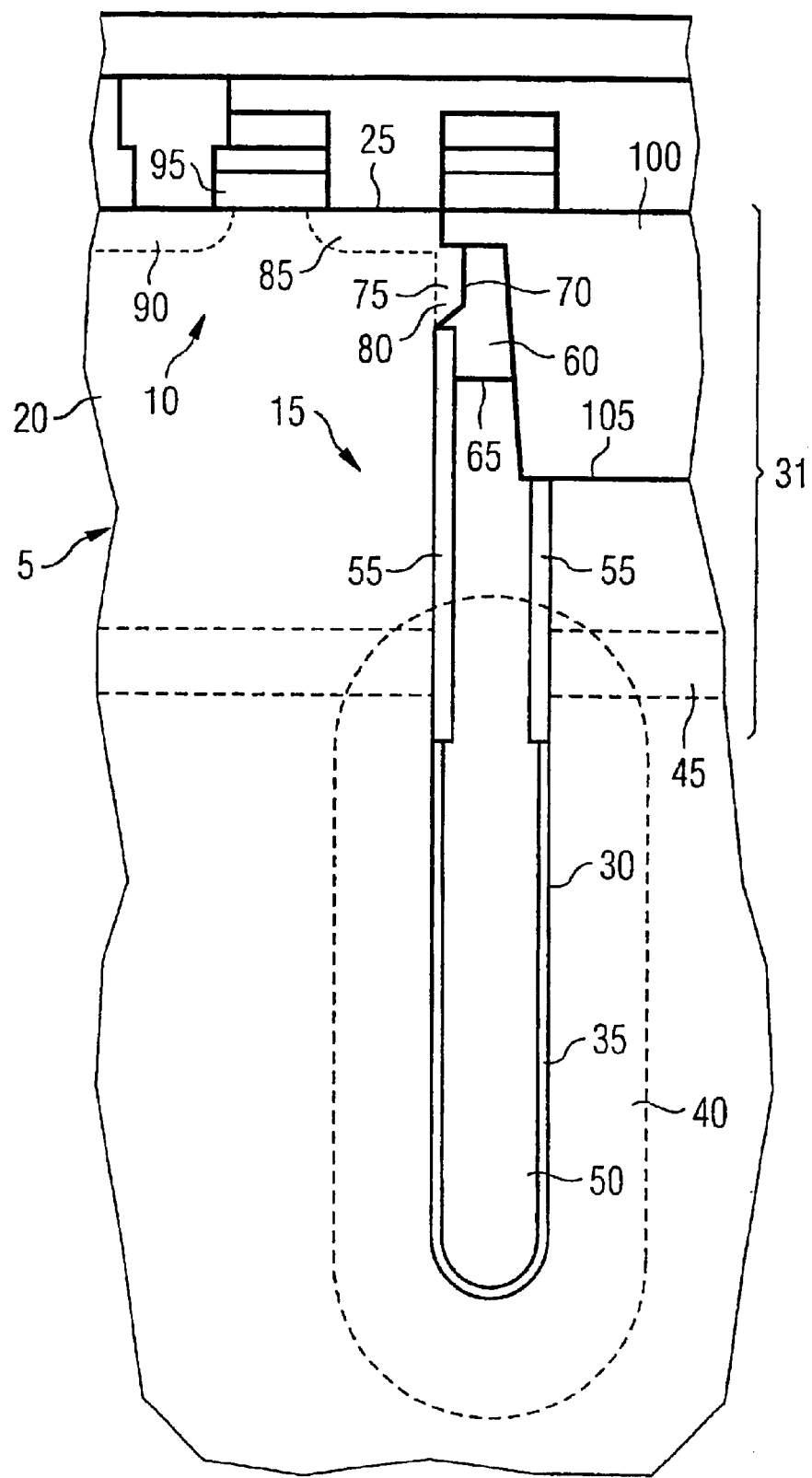
FIG. 1 is a diagrammatic, sectional view of a memory cell according to the invention with a trench capacitor and a selection transistor.

Referring now to the figures of the drawing in detail and first, particularly, to FIG. 1 thereof, there is shown a memory cell 5 containing a selection transistor 10 and a trench capacitor 15. In this case, the selection transistor 10 and the trench capacitor 15 are formed in a substrate 20 having a substrate surface 25. Disposed in the substrate 20 is a trench 30, in which the trench capacitor 15 is formed. The trench 30 has an upper region 31.

A capacitor dielectric 35 is disposed in the trench 30. A buried plate 40 as an outer capacitor electrode is disposed around the trench 30 in the substrate 20. Contact is made with the buried plate 40 by a buried well 45. Both the buried plate 40 and the buried well 45 are formed by a dopant in the substrate 20. A conductive trench filling 50 is disposed in the trench 30. The capacitor dielectric 35 is disposed between the buried plate 40 and the conductive trench filling 50. The conductive trench filling 50 is the inner capacitor electrode.

An insulation collar 55 is disposed in the upper region 31 of the trench 30. Disposed on the conductive trench filling 50 is a second intermediate layer 65, on which a buried strap 60 is disposed in the trench 30. In the upper region 31 of the trench 30, an epitaxially grown layer 75 is disposed at the sidewall of the trench 30. A first intermediate layer 70 is disposed between the epitaxially grown layer 75 and the buried strap 60. A dopant outdiffusion 80 is formed in the epitaxially grown layer 75 and the substrate 20.

The selection transistor 10 contains a first doping region 85 and a second doping region 90. Furthermore, the selection transistor 10 contains a gate 95, which controls the selection transistor 10. The first doping region 85 is connected to the dopant outdiffusion 80 by a dopant. A trench isolation 100 having a lower edge 105 is disposed in order to isolate the memory cell 5 illustrated in FIG. 1 from adjacent memory cells. In this case, the trench isolation 100 projects into the trench 30.

The substrate 20 is usually formed from silicon. The capacitor dielectric 35 contains, for example, a silicon oxide, a silicon nitride, a silicon oxynitride, tantalum oxide or dielectrics having a dielectric constant which is greater than 10. The buried plate 40 is a region in the substrate 20 in which a high dopant concentration of p or n dopant is disposed. The conductive trench filling 50 is formed from polycrystalline silicon, for example. The insulation collar 55 contains silicon oxide or silicon nitride, for example. The buried strap 60 contains, for example, doped or undoped polycrystalline or amorphous silicon or tungsten or tungsten nitride.

The epitaxially grown layer 75 usually contains doped or undoped monocrystalline silicon grown on the substrate 20. The dopant outdiffusion 80 is usually formed in monocrystalline silicon, p or n dopant such as, for example, arsenic, boron or phosphorus being introduced into the substrate 20 and the epitaxially grown layer 75. The first and second doping regions 85 and 90 likewise contain a dopant introduced into the substrate 20.

The trench isolation 100 usually contains silicon oxide or silicon nitride. In FIG. 1, the second intermediate layer 65 and thus the sinking depth of the conductive trench filling 50 is disposed above a lower edge 105 of the trench isolation.

Figure 2:
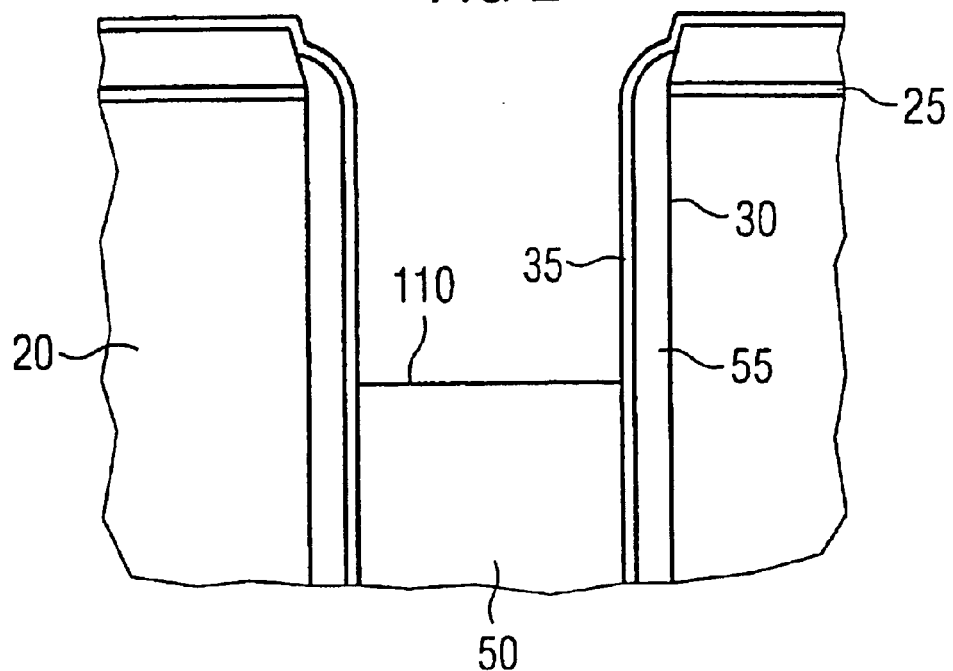
FIGS. 2 to 8 are sectional views showing method steps for the formation of an intermediate layer and of an epitaxially grown layer in the trench of the trench capacitor.

Method steps for fabricating the memory cell are explained with reference to FIG. 2. FIG. 2 illustrates the substrate 20 with the substrate surface 25. In the upper region 31 of the trench 30, the insulation collar 55 is disposed on the sidewall of the trench 30. The dielectric layer 35 is disposed on the insulation collar 55. By way of example, the is dielectric layer 35 may be the capacitor dielectric. Equally, it is possible for the dielectric layer 35 to have been formed separately and independently of the capacitor dielectric. In the trench 30, the conductive trench filling 50 has already been filled in and sunk into the trench 30 to a first sinking depth 110. Mask layers are disposed on the surface 25 of the substrate 20.

By way of example, if a planar transistor is disposed beside the trench capacitor in later method steps, then the first sinking depth 110 is formed approximately 100 nm below the substrate surface 25. If a vertical transistor is disposed in the trench capacitor, then the first sinking depth 110 is sunk into the trench 30 to a depth of approximately 350 nm, proceeding from the substrate surface 25.

For the memory cell with a planar selection transistor, a passing word line is disposed on the trench isolation (STI) and the active word line runs beside the trench in order to drive the planar selection transistor there. This is described in more detail with reference to FIG. 9.

For a vertical selection transistor, the active word line is disposed above the trench in order to make contact with and drive a gate arranged in the trench. The passing word line is disposed beside the trench in this case.

Figure 3:
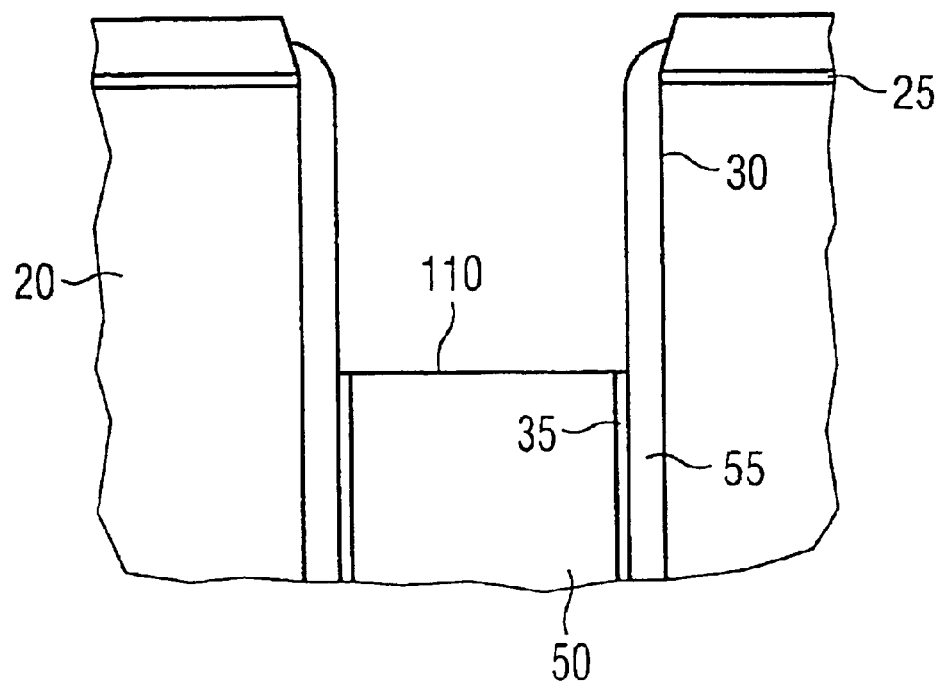

With reference to FIG. 3, the dielectric layer 35 is subsequently removed. This can be realized by a wet-chemical process, for example, in which case it is possible to use, for example, hydrofluoric acid which is buffered with ethylene glycol (HF/EG), in order to remove a dielectric layer composed of an oxynitride.

Figure 4:
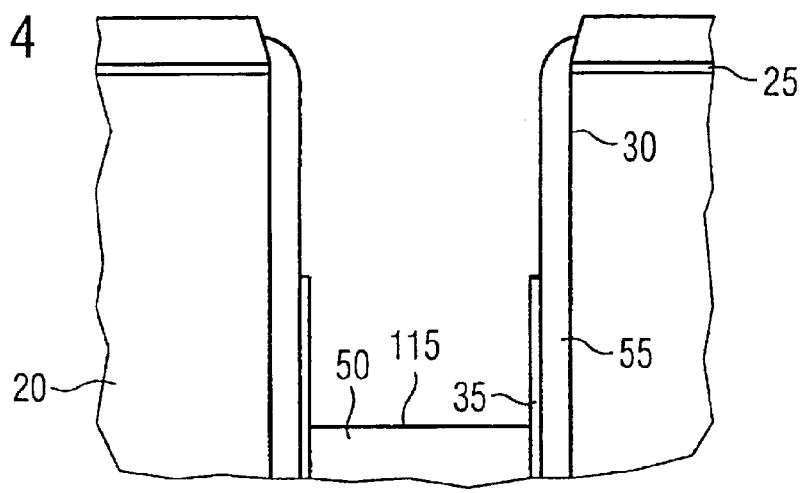

With reference to FIG. 4, the conductive trench filling 50 is sunk into the trench 30 to a second sinking depth 115. Part of the dielectric layer 35 is uncovered in the process.

Figure 5:
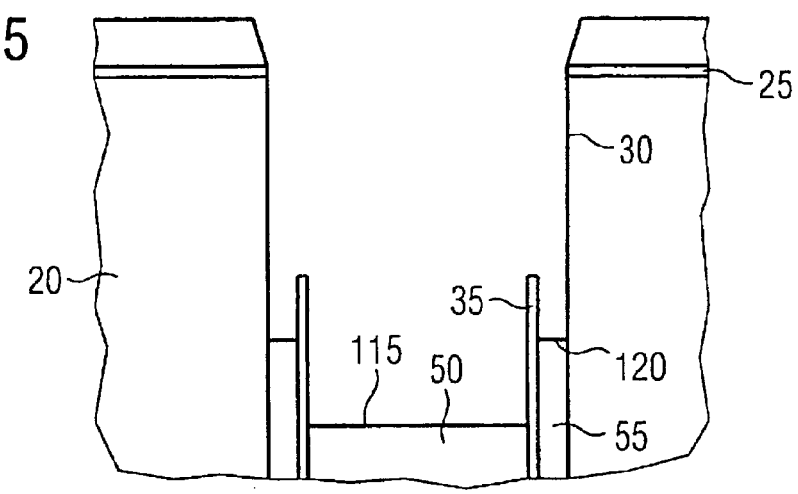

With reference to FIG. 5, the insulation collar 55 is subsequently removed from the sidewall of the trench 30. In this case, the insulation collar 55 remains at the sidewall of the trench 30 where it is protected from an etchant by the dielectric layer 35. If the insulation collar 55 is composed of silicon oxide, for example, then the insulation collar can be removed by wet-chemical etching that contains BHF (buffered HF: hydrofluoric acid buffered with $NH_4OH$). The etching can be carried out selectively with respect to the dielectric layer 35, which is composed of silicon nitride, for example, so that these layers remain.

Figure 6:
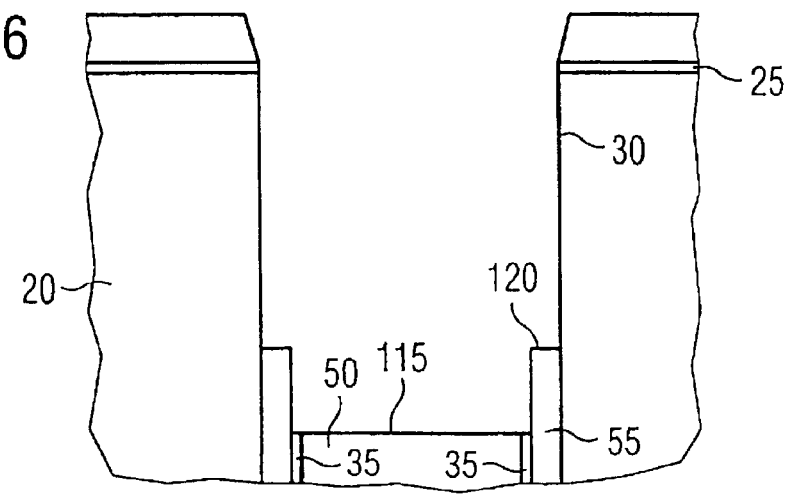
Figure 7:
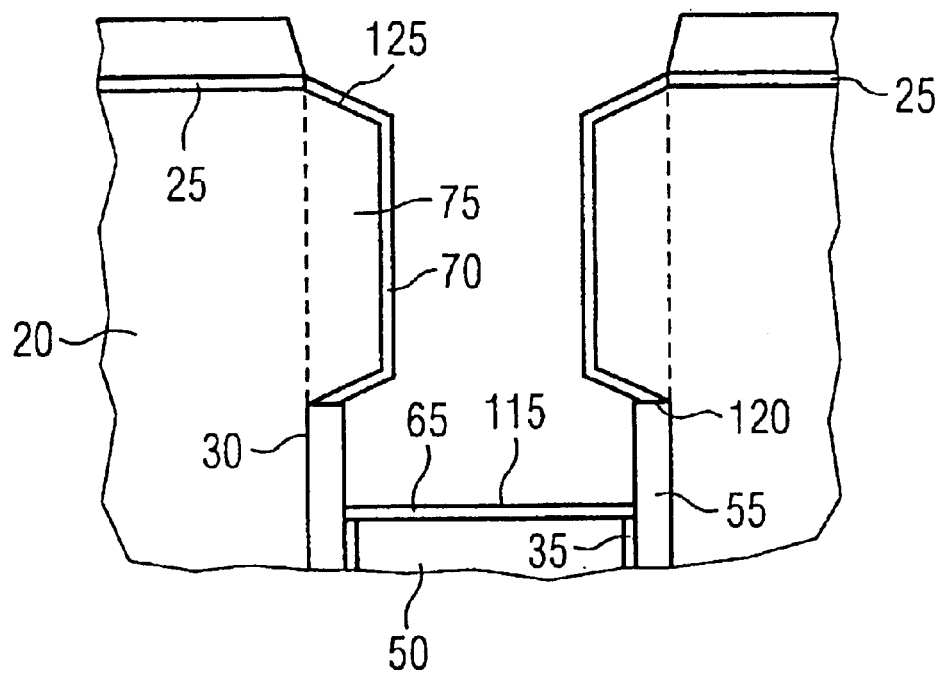

With reference to FIG. 6, the uncovered dielectric layer 35 is subsequently removed by a wet-chemical process, HF/EG being suitable as etchant for the dielectric layer 35 composed of silicon oxynitride. In FIG. 7, the sidewall of the trench 30, containing the substrate 20, is now uncovered, where the epitaxial layer 75 is grown on the substrate 20. The insulation collar 55 spaces apart the uncovered sidewall of the trench 30 from the second sinking depth 115 and thus from the second intermediate layer 65. In this case, the insulation collar 55 is sunk to a third sinking depth 120 disposed between the first sinking depth 110 and the second sinking depth 115.

The selective epitaxial growth described is carried out with reference to FIG. 7. By way of example, the selective epitaxy is grown to a thickness of, for example, 10 nm to 50 nm, preferably 30 nm, at a temperature of approximately 900° C. proceeding from the sidewall of the trench 30. This is carried out for example in an $SiH_2Cl_2$-containing (dichlorosilane: DCS) and hydrogen-containing atmosphere. Equally possible is a rapid thermal chemical vapor deposition (RTCVD) at 700° C. to 850° C. in ultra high vacuum (UHV) with little silane and hydrogen in the reaction chamber. Equally, the selective epitaxy can be carried out in a batch reactor, provided for more than one wafer, at a temperature of between 500° C. and 800° C. The batch process can also be carried out in UHV.

During the growth of the epitaxially grown layer 75, the natural growth fronts of the epitaxial layer 75 form, as a result of which a facet 125 is formed proceeding from the substrate surface 25 and the sidewall of the trench 30 at an angle of 45° relative to the substrate surface.

The first intermediate layer 70 is subsequently formed on the epitaxially grown layer 75. This can be carried out for example by thermal nitriding of the epitaxially grown layer.

A thermal oxidation of the epitaxially grown layer 75 is equally possible. Further methods for the formation of the first intermediate layer 70 provide for a layer to be deposited. This may be, for example, a metallic or metal-nitride-containing layer. By way of example, tungsten nitride, titanium nitride, tungsten, tungsten silicide, titanium silicide or cobalt silicide are suitable for this purpose. It is likewise provided that the first intermediate layer 70 and the second intermediate layer 65 are formed simultaneously in one process step and from the same material.

Figure 8:
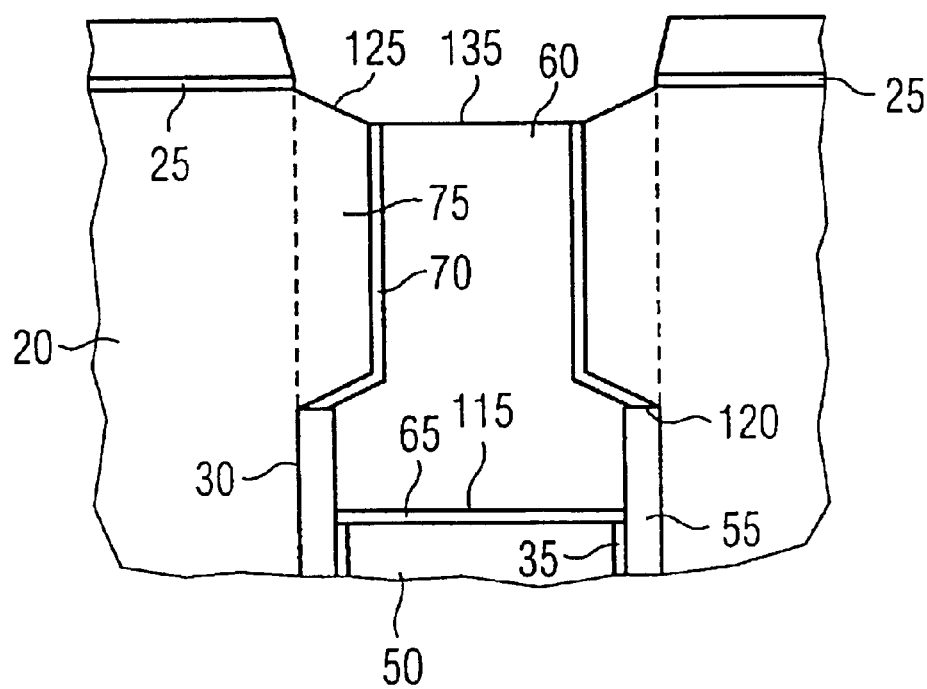

With reference to FIG. 8, the buried strap 60 is subsequently formed by polysilicon, for example, being deposited on the substrate 20 and in the trench 30 and being sunk into the trench to a fourth sinking depth 135. By way of example, the first intermediate layer is removed from the facet 125 in the process.

In order to configure the buried strap 60 in a manner free from shrink holes, the trench 30 can first be filled with a conformal layer, a shrink hole first being formed in the trench 30. Afterwards, the trench 30 is etched free by a directed etching, spacers remaining below the epitaxial layer 75. Renewed deposition of a conformal layer into the trench 30 then forms the buried strap in a manner free from shrink holes.

Figure 9:
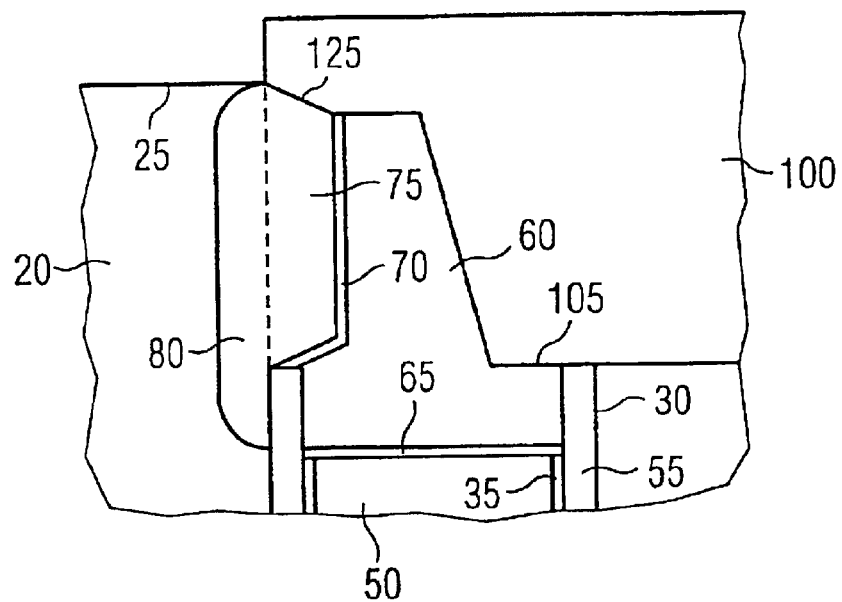
FIG. 9 is a sectional view showing the configuration from FIG. 8 for the memory cell with a planar selection transistor, and a trench isolation additionally having been formed.

With reference to FIG. 9, method steps that are usually suitable for producing a DRAM memory cell with a planar selection transistor are subsequently carried out. First, a dopant is outdiffused from the buried strap 60, the dopant diffusing into the epitaxially grown layer 75 and the substrate 20. The fact that the first intermediate layer 70 is at a greater distance from the selection transistor 10 and the sidewall of the trench 30 prevents short-channel effects in the selection transistor 10. The trench isolation 100 is subsequently formed with the lower edge 105 by a trench first being etched, which is subsequently filled with silicon oxide. It is advantageous in this case that the second intermediate layer 65 is disposed below the lower edge 105 of the trench isolation 100. This configuration is suitable, for example, for forming a planar transistor beside the trench 30 in order to complete the memory cell. In this case, the active word line is disposed beside the trench in order to drive the planar selection transistor. The passing word line is disposed on the trench isolation (STI), for example.

Figure 10:
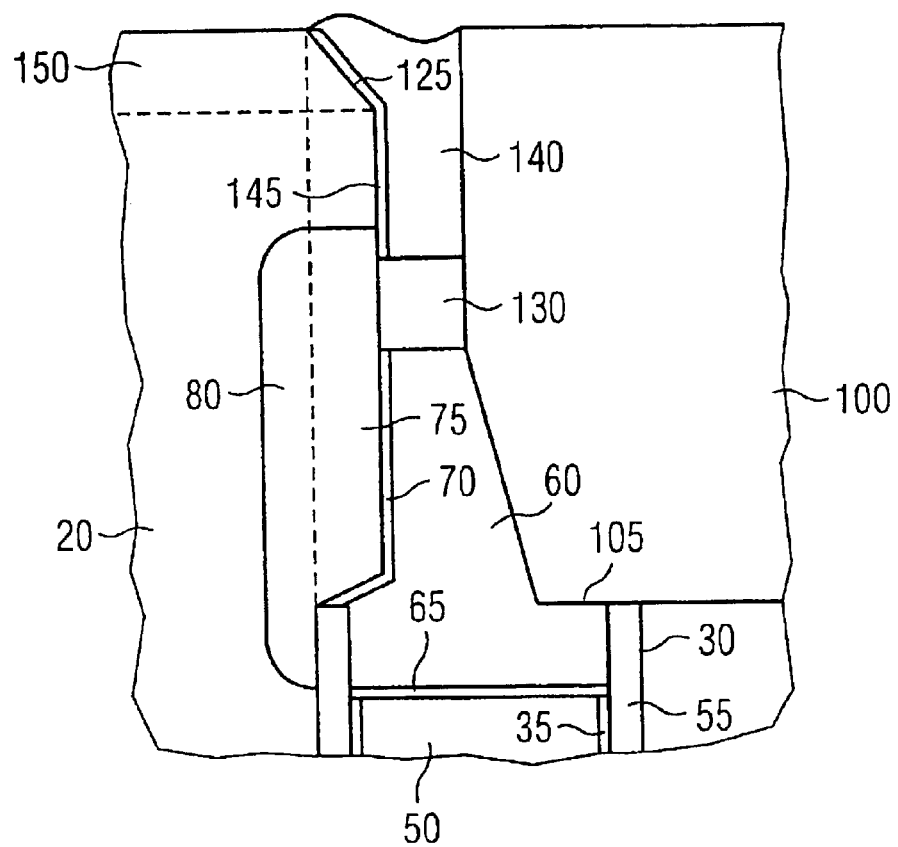
FIG. 10 is a sectional view showing the configuration from FIG. 8 for the memory cell with a vertical selection transistor.

With reference to FIG. 10, a configuration is illustrated in which a vertical transistor is subsequently formed in the trench 30. To that end, by way of example, a known method is specified in the above-mentioned publication by U. Gruening. According to the invention, an insulation layer 130, which is also referred to as top trench oxide (TTO), is disposed on the buried strap 60. Above the insulation layer 130, a gate oxide 145 is disposed on the epitaxially grown layer 75. Disposed above the insulation layer 130, beside the gate oxide 145, is a gate 140 that is connected to a word line running above the trench and controls the vertical selection transistor.

Figure 11:
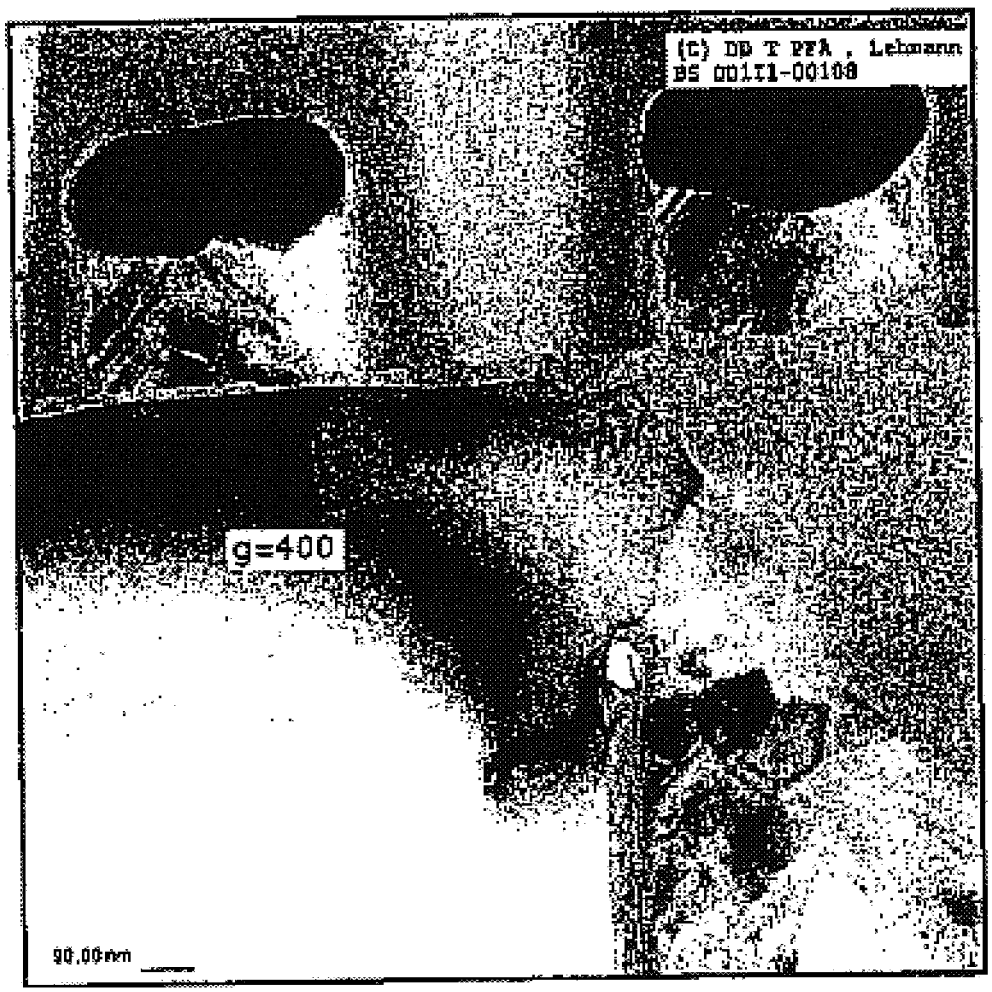
FIG. 11 is an SEM recorded image of the memory cell according to the prior art.

FIG. 11 shows a scanning electron microscope (SEM) recorded image of a memory cell according to the prior art. The two polysilicon gates with the two word lines are discernible on the substrate surface. An STI is formed beneath the right-hand word line, the right-hand word line being disposed on the STI. The trench capacitor with an insulation collar (vertical line with a hole shown white at the upper end) is shown at the bottom on the right. Crystal dislocations and strains in the silicon disposed beside the trench are clearly discernible as a curved line; these can damage the selection transistor disposed beneath the left-hand word line.

Figure 12:
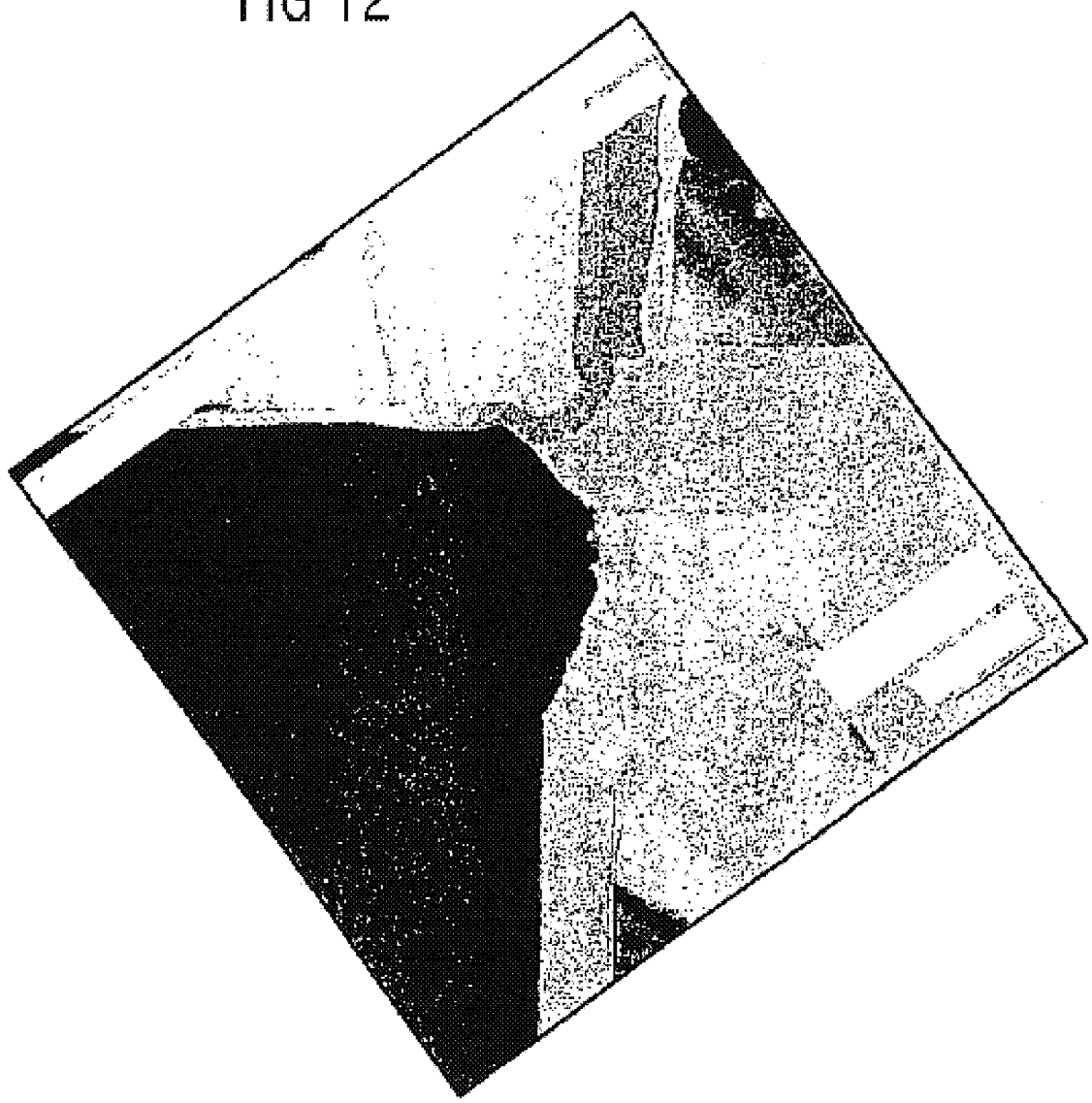
FIG. 12 is an SEM recorded image of the memory cell according to the invention.

FIG. 12 shows an excerpt from the memory cell according to the invention that shows the region of the selectively grown layer 75 in enlarged fashion. The monocrystalline bulk silicon and the epitaxially grown layer 75 are shown dark. Crystal dislocations and strains are avoided or prevented on account of the first intermediate layer 70 according to the invention. Two variants with respect to the process sequence illustrated in FIGS. 2 to 7 are illustrated in FIGS. 13 to 17 and FIGS. 18 to 20. Both variants proceed from a substrate whose capacitor dielectric was introduced before the formation of the insulation collar, so that another layer is required for defining the depth to which the insulation collar is etched back.

Figure 13:
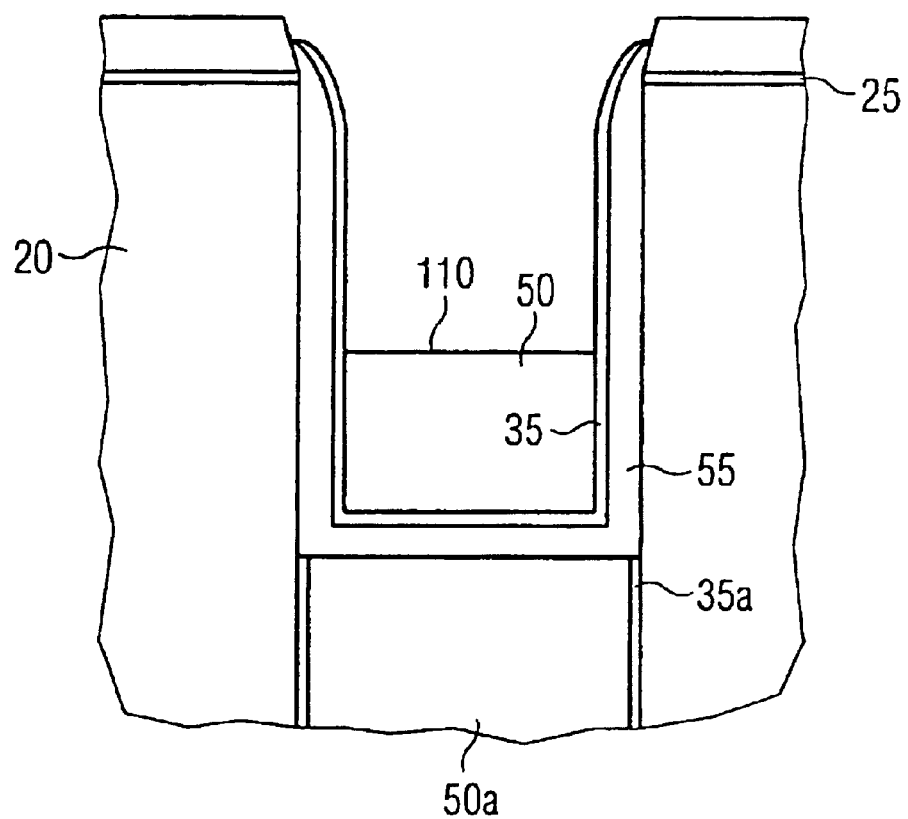
FIGS. 13 to 17 are sectional views showing a variant with respect to the process sequence illustrated in FIGS. 2 to 7.
Figure 14:
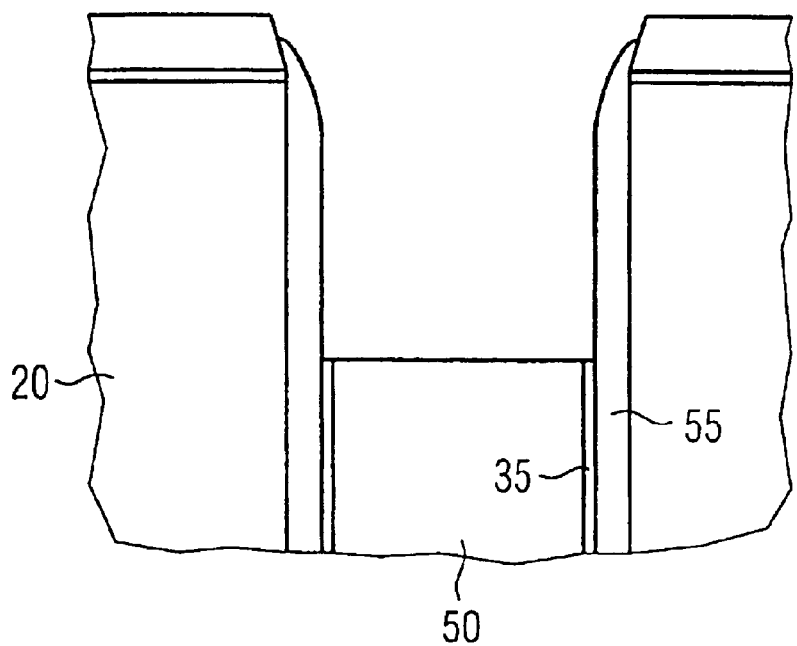
Figure 15:
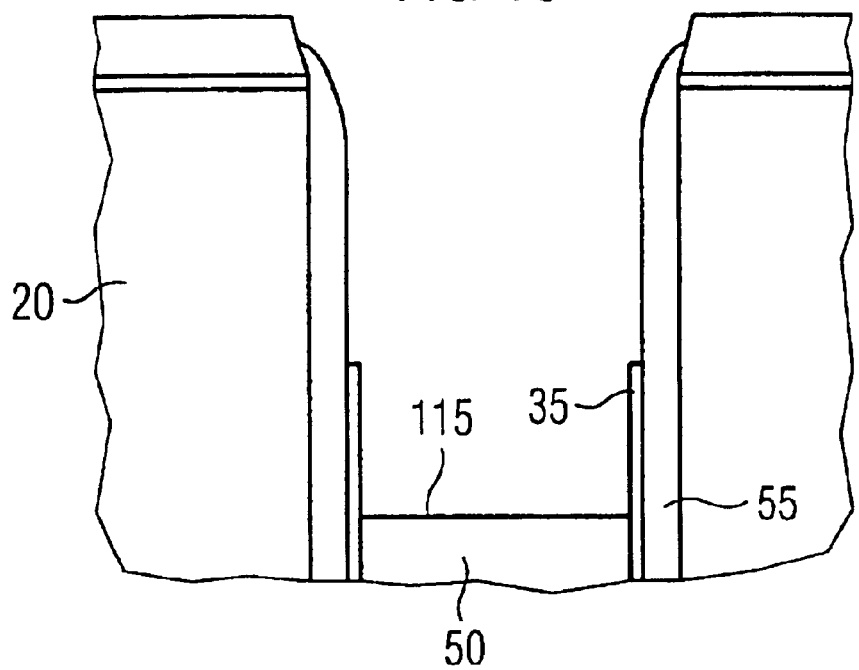
Figure 16:
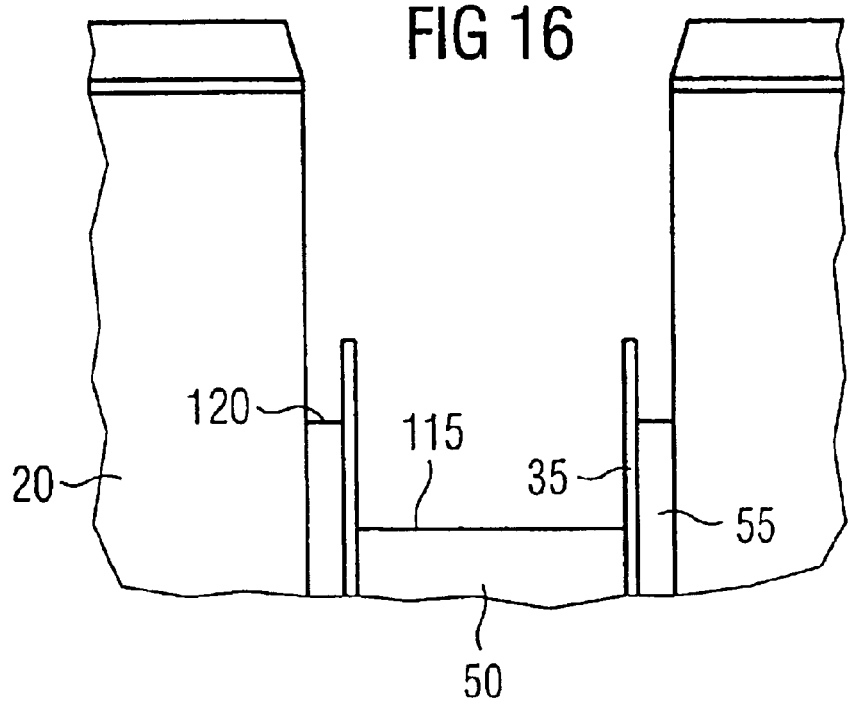
Figure 17:
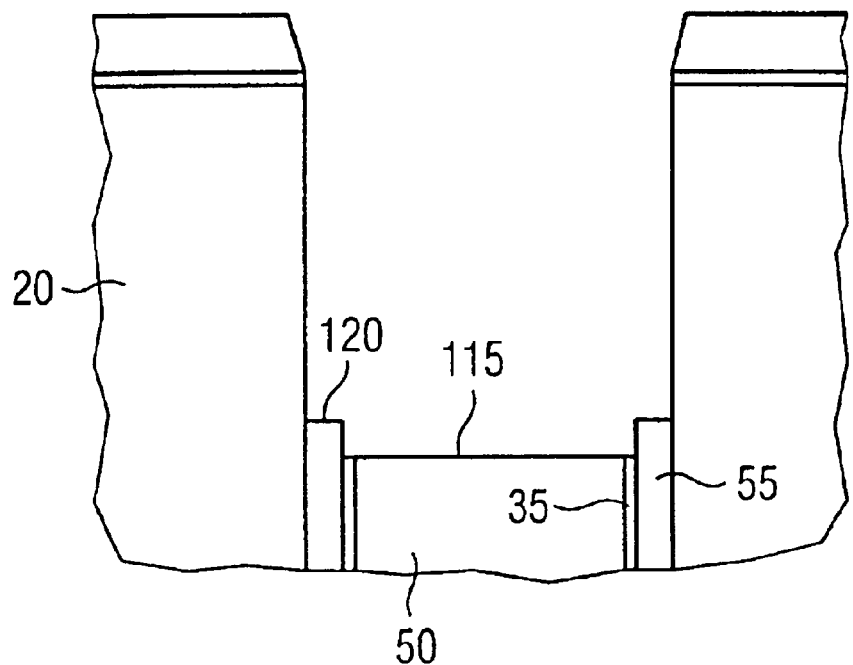

The first variant in accordance with FIGS. 13 to 17 corresponds to the method stage in accordance with FIG. 2, but, in contrast to FIG. 2, the capacitor has already been produced, and, above a capacitor dielectric 35a and a storage node 50a containing a first polysilicon filling, the insulation collar 55 is also applied at the remaining bottom area. It is covered by a further dielectric layer 35, over which the conductive trench filling 50, a second polysilicon filling, is introduced. The latter, as shown in FIG. 13, is etched back down to the first sinking depth 110 in order, in accordance with FIG. 14, to remove the dielectric layer 35 above that. In accordance with FIG. 15, the trench filling 50 is then etched back down to the second, deeper and final sinking depth 115. The projecting dielectric layer 35 can then be used to etch back the insulation collar 55 down to a third sinking depth 120, which will be somewhat deeper than the first but smaller than the second sinking depth, in order to apply the epitaxial layer 75 above the insulation collar 55. The dielectric layer 35 that still projects in accordance with FIG. 16 is removed beforehand (FIG. 17). The rest of the method is continued as from FIG. 7.

Figure 18:
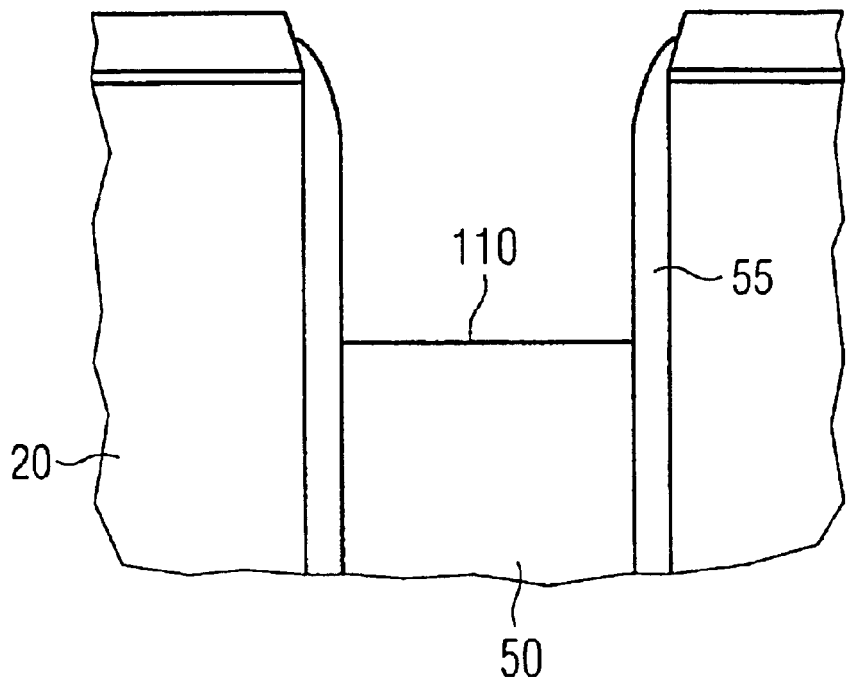
FIGS. 18 to 20 are sectional views showing a variant with respect to the process sequence illustrated in FIGS. 2 to 7.
Figure 19:
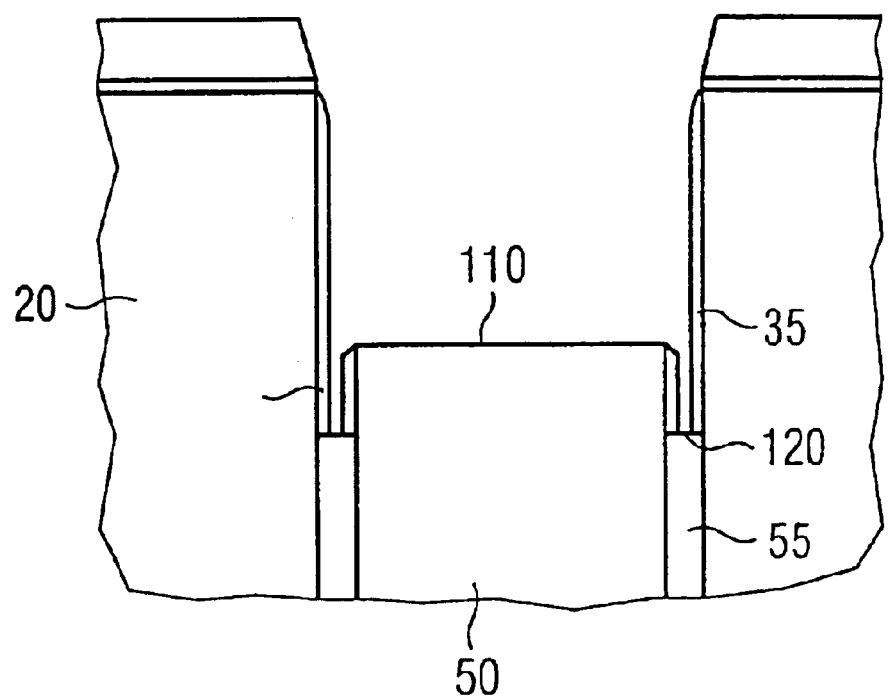
Figure 20:
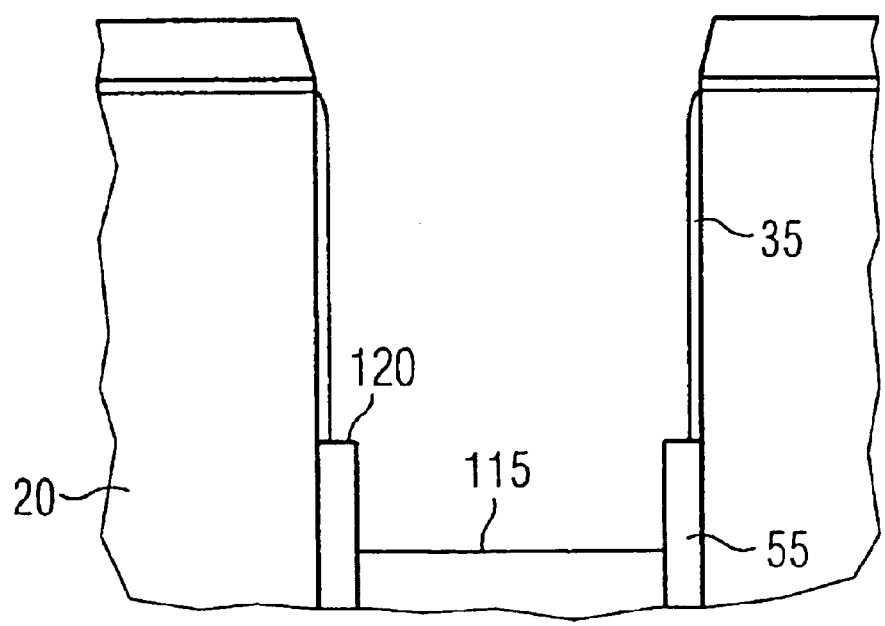

The second alternative variant to FIGS. 2 to 7 in accordance with FIGS. 18 to 20, in contrast thereto and to the previous variant, provides no dielectric layer on the insulation collar 55. Instead, the sinking depth 120 of the insulation collar 55 is etched back directly with the aid of the trench filling 50 (a second polysilicon filling above the storage node 50a) etched back in accordance with FIG. 18, to be precise as far as the sinking depth 120 which is slightly deeper than the first sinking depth 110 (FIG. 19). The uncovered sidewall of the trench 30 is then covered directly with the dielectric layer 35 which serves to protect the sidewall during the subsequent further etching-back of the trench filling 50 down to the second sinking depth 115 (FIG. 20). Dielectric material that is present on trench filling material that is elevated relative to the sunk insulation collar is etched back at the same time as the trench filling. The method is then continued in accordance with FIG. 7.

Figure 21:
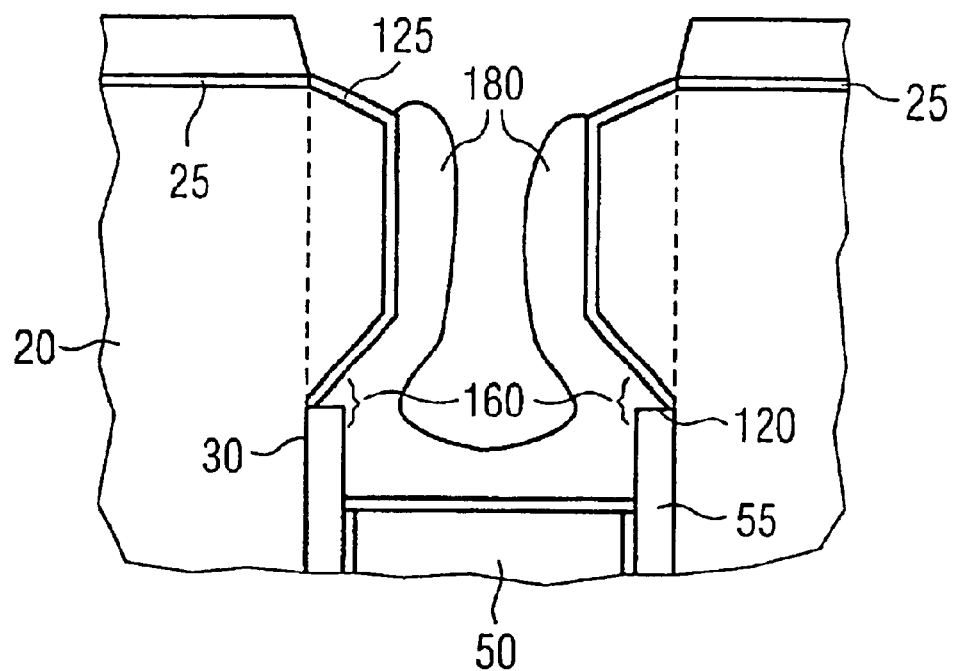
FIGS. 21 and 22 are sectional views showing method steps for filling an annular gap between the epitaxial layer and the insulation collar.
Figure 22:
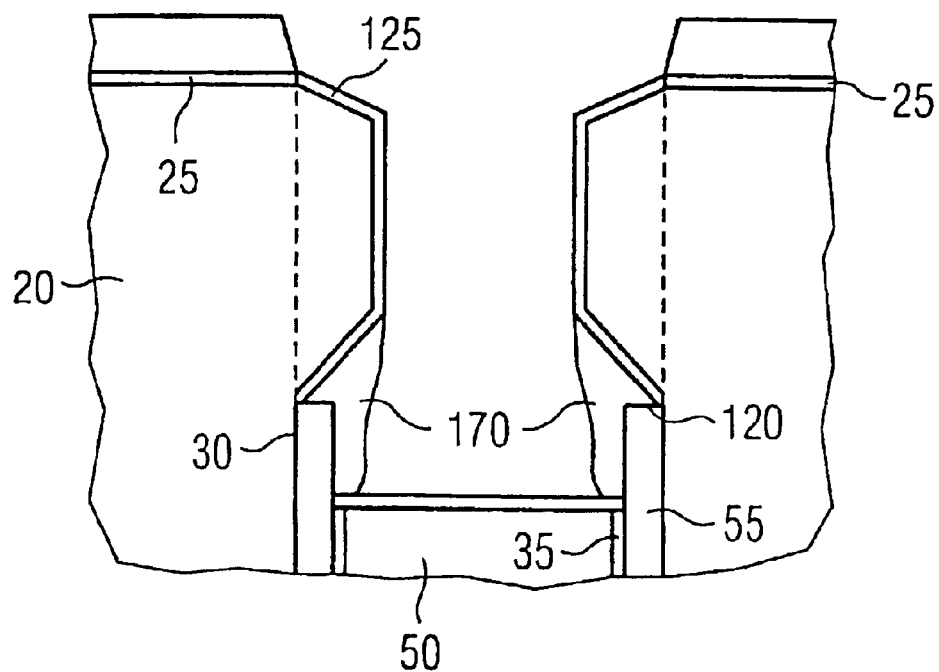

FIGS. 21 and 22 show method steps for filling an annular gap 160 between the epitaxial layer 75 and the insulation collar 55, which forms on account of the faceting of the epitaxial layer 75 towards the insulation collar 55. There, filling material of the buried strap 60 that is pervious to dopants can lead to greater outdiffusion into the substrate 20 on account of its spatial proximity to the trench sidewall. In order to avoid this, proceeding from FIG. 7, in accordance with FIG. 21 first a layer 180 made of a diffusion-blocking material, preferably a nitride such as silicon nitride, is deposited isotropically. The isotropically deposited diffusion barrier is subsequently removed anisotropically in the direction perpendicular to the substrate surface 25 in accordance with FIG. 22, the diffusion-blocking material remaining in the inaccessible annular gap 160 between the facet 125 of the epitaxial layer 75 and the upper edge of the insulation collar 55 and later preventing an intensified outdiffusion from this annular gap 160. The rest of the method is then continued in the manner illustrated in FIG. 7, beginning with the deposition of the first intermediate layer 70, which is deposited at the same time in the region 65 on the storage node.

We claim:

1. A method for fabricating a semiconductor memory having a trench capacitor and a selection transistor, which comprises the steps of:
    providing a substrate having a substrate surface with a trench formed therein, the trench having an upper region;
    forming an insulation collar in the upper region on a sidewall of the trench;
    depositing a dielectric layer functioning as a capacitor dielectric on the insulation collar;
    providing a conductive trench filling in the trench;
    sinking the conductive trench filling into the trench to a first sinking depth;
    removing the dielectric layer from the insulation collar in a region above the first sinking depth;
    sinking the conductive trench filling into the trench to a second sinking depth;
    uncovering the substrate at the sidewall of the trench above the conductive trench filling resulting in an uncovered sidewall;
    growing an epitaxial layer on the uncovered sidewall of the trench;
    forming an intermediate layer on the epitaxial layer;
    introducing a dopant into the epitaxial layer; and
    completing the trench capacitor and the selection transistor.

2. The method according to claim 1, which further comprises removing an upper part of the insulation collar for uncovering the substrate at the sidewall of the trench.

3. The method according to claim 1, which further comprises forming a trench insulation in the substrate and in the trench.

4. The method according to claim 1, which further comprises growing the epitaxial layer such that a facet is formed with an angle of approximately 45 degrees relative to the substrate surface.

5. The method according to claim 4, which further comprises introducing a barrier layer into an annular gap formed by the facet and an upper edge of the insulation collar, the barrier layer preventing dopant diffusions into the sidewall of the trench, the barrier layer being formed by depositing isotropocally a material, impervious to the dopant, at an edge of a trench opening, into the trench and then being etched back anisotropically in a direction perpendicular to the substrate surface.

6. The method according to claim 1, which further comprises removing the insulation collar above a third sinking depth.

7. The method according to claim 6, which further comprises setting the third sinking depth to be greater than the first sinking depth and less than the second sinking depth.

8. A method for fabricating a semiconductor memory having a trench capacitor and a selection transistor, which comprises the steps of:
    providing a substrate having a substrate surface with a trench formed therein, the trench having an upper region and a lower region;
    providing a first dielectric layer in the lower region of the trench;

forming an insulation collar in the upper region on a sidewall of the trench;

depositing a second dielectric layer on the insulation collar;

providing a conductive trench filling in the trench;

sinking the conductive trench filling into the trench to a first sinking depth;

removing the second dielectric layer from the insulation collar in a region above the first sinking depth;

sinking the conductive trench filling into the trench to a second sinking depth;

uncovering the substrate at the sidewall of the trench above the conductive trench filling resulting in an uncovered sidewall;

growing an epitaxial layer on the uncovered sidewall of the trench;

forming an intermediate layer on the epitaxial layer;

introducing a dopant into the epitaxial layer; and completing the trench capacitor and the selection transistor.

9. The method according to claim 8, which further comprises removing an upper part of the insulation collar for uncovering the substrate at the sidewall of the trench.

10. The method according to claim 8, which further comprises forming a trench insulation in the substrate and in the trench.

11. The method according to claim 8, which further comprises growing the epitaxial layer such that a facet is formed with an angle of approximately 45 degrees relative to the substrate surface.

12. The method according to claim 11, which further comprises introducing a barrier layer into an annular gap formed by the facet and an upper edge of the insulation collar, the barrier layer preventing dopant diffusions into the sidewall of the trench, the barrier layer being formed by depositing isotropocally a material, impervious to the dopant, at an edge of a trench opening, into the trench and then being etched back anisotropically in a direction perpendicular to the substrate surface.

13. The method according to claim 8, which further comprises removing the insulation collar above a third sinking depth.

14. The method according to claim 13, which further comprises setting the third sinking depth to be greater than the first sinking depth and less than the second sinking depth.

15. A method for fabricating a semiconductor memory having a trench capacitor and a selection transistor, which comprises the steps of:

providing a substrate having a substrate surface with a trench formed therein, the trench having an upper region;

forming an insulation collar in the upper region on a sidewall of the trench;

providing a conductive trench filling in the trench;

sinking the conductive trench filling into the trench to a first sinking depth;

uncovering the substrate at the sidewall of the trench above the conductive trench filling resulting in an uncovered sidewall;

depositing a dielectric layer directly onto the uncovered sidewall of the trench;

sinking the conductive trench filling into the trench to a second sinking depth;

removing the dielectric layer from the sidewall of the trench;

growing an epitaxial layer on the uncovered sidewall of the trench;

forming an intermediate layer on the epitaxial layer;

introducing a dopant into the epitaxial layer; and completing the trench capacitor and the selection transistor.

16. The method according to claim 15, which further comprises removing an upper part of the insulation collar for uncovering the substrate at the sidewall of the trench.

17. The method according to claim 15, which further comprises forming a trench insulation in the substrate and in the trench.

18. The method according to claim 15, which further comprises growing the epitaxial layer such that a facet is formed with an angle of approximately 45 degrees relative to the substrate surface.

19. The method according to claim 18, which further comprises introducing a barrier layer into an annular gap formed by the facet and am upper edge of the insulation collar, the barrier layer preventing dopant diffusions into the sidewall of the trench, the barrier layer being formed by depositing isotropocally a material, impervious to the dopant, at an edge of a trench opening, into the trench and then being etched back anisotropically in a direction perpendicular to the substrate surface.

20. The method according to claim 15, which further comprises removing the insulation collar above a third sinking depth.

21. The method according to claim 20, which further comprises setting the third sinking depth to be greater than the first sinking depth and less than the second sinking depth.

* * * * *